United States Patent [19]
Latshaw

[11] Patent Number: 4,685,136
[45] Date of Patent: Aug. 4, 1987

[54] TRIPHONIC SOUND SYSTEM

[76] Inventor: Don Latshaw, 1 Alta Mira, San Luis Obispo, Calif. 93401

[21] Appl. No.: 890,092

[22] Filed: Jul. 28, 1986

Related U.S. Application Data

[62] Division of Ser. No. 685,295, Dec. 24, 1984, Pat. No. 4,615,043.

[51] Int. Cl.⁴ .......................... H03G 3/00; H04R 5/00
[52] U.S. Cl. ....................................... 381/108; 381/27
[58] Field of Search ................ 307/264, 359; 328/168, 328/175; 381/102, 103, 104, 106, 108, 121, 6, 16, 15; 179/81 B

[56] References Cited

U.S. PATENT DOCUMENTS

| | | | |
|---|---|---|---|
| 4,127,813 | 11/1978 | Hiroshima | 328/168 |
| 4,520,498 | 5/1985 | Hershberger | 381/16 |
| 4,527,014 | 7/1985 | Styrna | 179/81 B |
| 4,602,169 | 7/1986 | Shimizo | 307/359 |

*Primary Examiner*—Forester W. Isen
*Attorney, Agent, or Firm*—Daniel C. McKown

[57] ABSTRACT

In a conventional stereo system, provided the listener remains equidistant from the left and right speakers, the common portions of the left and right signals produce in the mind of the listener the virtual source of sound thought to be located between the left and right speakers. In the present invention, the common components are used to power a third speaker located between the left and right speakers thereby providing a real source of sound, whereby the listener is not required to remain equidistant from the left and right speakers, but instead has considerably more latitude with respect to his position. The present invention takes the left and right signals produced by a stereo decoder, equalizes them, and develops a commonality index on which the allocation of the signals to the three speakers is based. Linear combinations of the equalized left and right signals are applied to the speakers with the coefficients each being a function only of the commonality index.

3 Claims, 6 Drawing Figures

TRIPHONIC SOUND SYSTEM

This is a division of application Ser. No. 685,295 filed Dec. 24, 1984, now U.S. Pat. No. 4,615,043.

BACKGROUND OF THE INVENTION

1. Field of the Invention

The present invention is in the field of sound reproduction systems and in particular relates to a system usable in theaters and homes, and having three sources of sound; right, left, and center. 2. The Prior Art In U.S. Pat. No. 3,944,735 issued Mar. 16, 1976 to Willcocks, there is disclosed a system that enhances the directionality in quadraphonic systems. The system operates on the four outputs of a decoder to alter the signals in the four channels so as to move the sound from speaker to speaker. The system also includes circuitry for controlling the rate of attack and rate of decay.

In U.S. Pat. No. 4,063,032 issued Dec. 13, 1977, Willcocks discloses a manually adjusted balance control for stereo or quadraphonic sound systems in which the output power is maintained constant so that when one channel is increased, the other channel or channels necessarily is decreased.

SUMMARY OF THE INVENTION

The present invention includes apparatus that operates on the outputs L′, R′ of a stereo decoder, and produces from these signals the signals that are applied to a left speaker, a right speaker, and one or more center speakers.

From the outputs L′, R′ of the stereo decoder, the present invention develops equalized left and right signals L, R.

From the balanced left and right signals L, R an electrical signal k, referred to herein as a commonality index is developed. The commonality index k is a measure of the time-averaged degree of similarity between the left signal L and the right signal R, so that when $k=1$ the left and right channels are identical and the signal is purely monophonic. On the other hand, when $k=0$ the signal is entirely stereophonic with no commonality between the left and right channels.

The present invention employs the commonality index k by generating various functions of k. These functions of k are used in forming linear combinations of the L and R signals, and specific linear combinations of L and R are then applied to each of the speakers.

The generated functions of k are related, in accordance with the present invention, in such a way that the listener perceives a constant power sound field as the signal changes from stereophonic to monophonic.

That is not to say that the listener does not perceive variations in the loudness of the program material, but instead, if the loudness of the program material remains constant as the signal changes from steoeophonic to monophonic (or vice versa) the listener will not notice any perceptible change in loudness as the signal changes from stereophonic to monophonic.

The effect produced by the apparatus of the present invention is as follows. If the left and right signals L, R have nothing in common, all of the signal power will be applied to the left and right speakers, and the system operates as a stereophonic system. At the other extreme, if the signals L, R are identical, the signal power is steered to the center speaker or speakers and no power is applied to the left and right speakers. In this case, the listener hears only a monophonic sound source, but the loudness of that source is the same as the loudness he perceived in the earlier situation where the signal was entirely stereophonic with no commonality (assuming the program material to be of constant loudness).

Most of the time, an intermediate situation prevails in which both the stereo speakers and the center speakers are operating simultaneously, and even in this intermediate situation, the power applied to the speakers is determined in such a way that the listener perceives constant loudness.

One of the advantages of the system of the present invention is that it balances the L and R signals. This is essential for maintaining constant loudness when a sound initially appears in the left channel exclusively, and then moves to the right channel exclusively. This balancing is also very convenient to the listener who would otherwise feel compelled to manually balance the channels from time to time.

A further advantage of the present invention is that, unlike conventional stereo systems, where the listener is expected to position himself equidistant from the speakers with the left speaker on his left and the right speaker on his right, in the present invention, the listener is under no such constraint because the center speaker, by virtue of its location provides an actual physical sound source that replaces the virtual sound source of the stereo system that constrained the listener. As a result, the listener is considerably less restricted in his location when he is using the system of the present invention.

The novel features which are believed to be characteristic of the invention, both as to organization and method of operation, together with further objects and advantages thereof, will be better understood from the following description considered in connection with the accompanying drawings in which a preferred embodiment of the invention is illustrated by way of example. It is to be expressly understood, however, that the drawings are for the purpose of illustration and description only and are not intended as a definition of the limits of the invention.

DETAILED DESCRIPTION OF THE PREFERRED EMBODIMENTS

Figures 1, 2, 6:
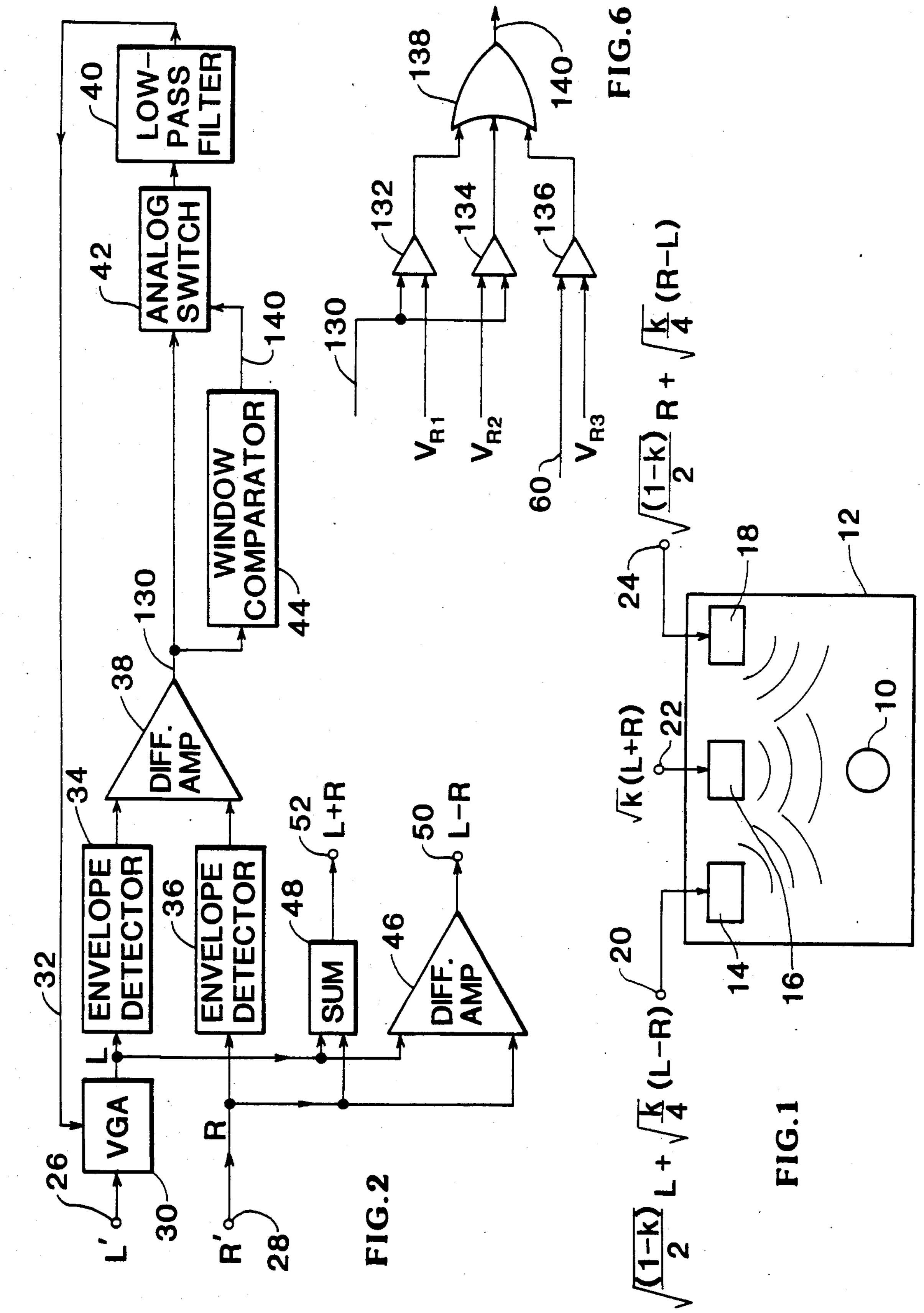
FIG. 1 is a diagram showing a plan view of a room in which a preferred embodiment of the present invention is installed.
FIG. 2 is a block diagram of an equalization circuit that is used in the preferred embodiment of the present invention.
Figures 4, 5:
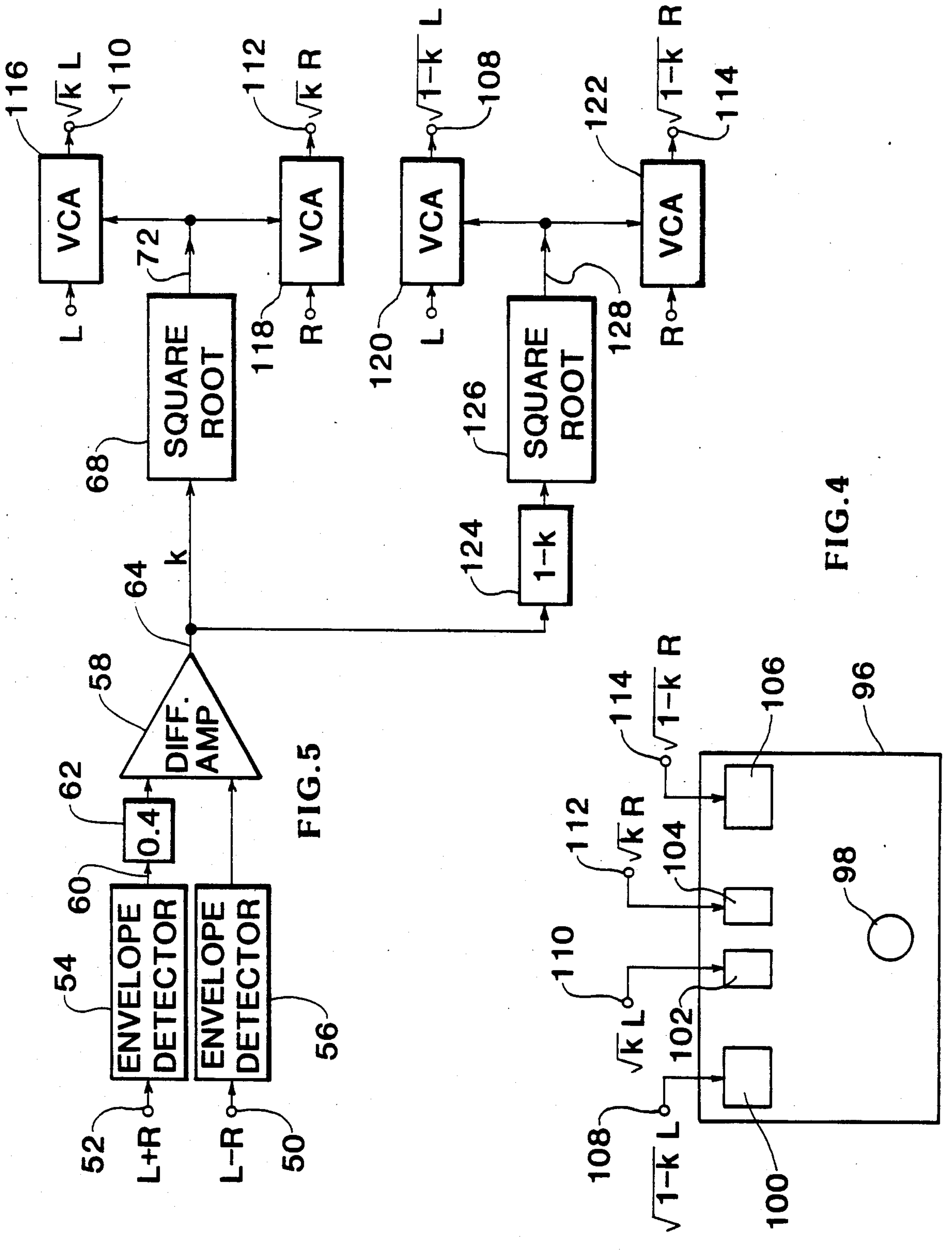
FIG. 4 is a diagram showing a plan view of a room in which an alternative embodiment of the present invention is installed.
FIG. 5 is a block diagram showing the steering circuit used in the alternative embodiment of the present invention; and, FIG. 6 is a circuit diagram showing the window comparator of FIG. 2 in greater detail.

FIGS. 1–3 and 6 relate to a preferred embodiment of the present invention, while FIGS. 4 and 5 relate to an alternative embodiment. The equalization circuit of FIGS. 2 and 6 is common to both embodiments.

FIG. 1 shows a room 12 in which a listener 10 listens to the sounds produced by the left speaker 14, the center speaker 16, and the right speaker 18. The speakers are energized by signals applied respectively to the input terminal 20 of the left speaker, the input terminal 22 of the center speaker and the input terminal 24 of the right speaker. These terminals are also shown in FIG. 3.

Figure 3:
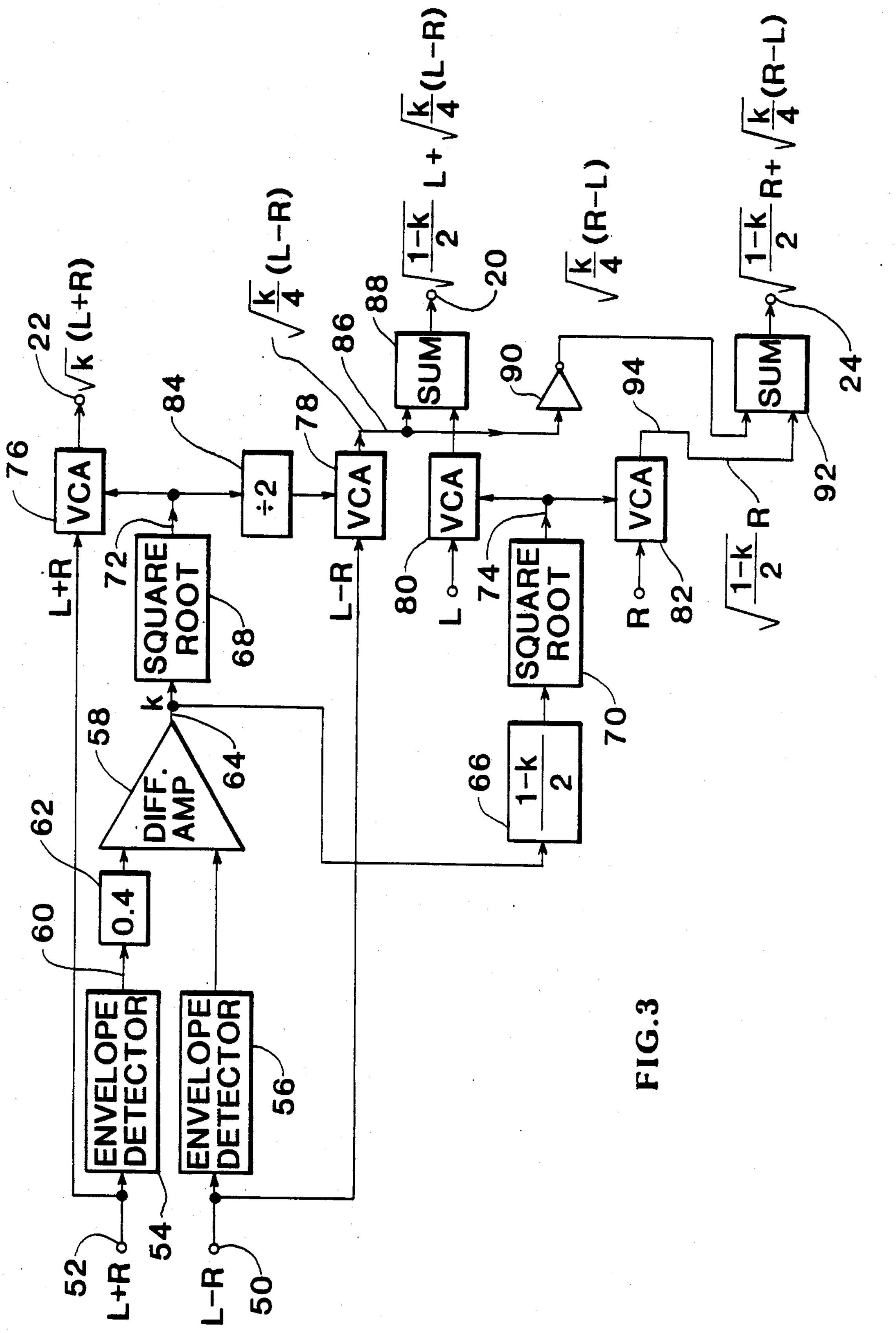
FIG. 3 is a block diagram of a steering circuit that is used in the preferred embodiment.

In accordance with the present invention, the signals applied to the speakers of FIG. 1 are produced by the circuits shown in FIGS. 2 and 3, in a preferred embodiment.

Turning now to FIG. 2, the inputs L', R' are the outputs of a stereo decoder. The decoder may consist of a stereo tuner, or it may be apparatus used for deriving a pair of stereo signals from a sound track of a motion picture. Regardless of the source, the input signls L', R' are applied respectively to the terminals 26, 28 of FIG. 2.

As will be seen, the left channel signal is adjusted to bring it into balance with the right channel signal.

The letters L', R' and L, R denote instantaneous voltage values of the respective signals. However, it is not the instantaneous values that are balanced, for that would produce a very unnatural sound, but instead, it is the average values of the R and L signals that are balanced. In the best mode of practicing the invention, it has been found that a filter with a time constant in the range of 20 to 100 seconds produces the best results.

Because the R' signal is not adjusted, it is identically equal to the R signal, but the L signal may differ from the L' signal. The conversion of the L' signal to the L signal is accomplished in the variable gain amplifier 30 under control of the feedback signal on the line 32.

Since it is the L signal that is being equalized to the R signal, the L signal and the R signal are applied respectively to the envelope detectors 34, 36.

The envelope detectors 34, 36 include filters that have substantially equal time constants, and the value of the time constant should be in the range from 10 to 20 msec. The outputs of the envelope detectors 34, 36 are applied to the differential amplifier 38. The difference signal is applied to the low-pass filter 40 through the analog switch 42.

The analog switch 42 is normally closed, but the switch is controlled by the window comparator 44 that opens the analog switch when the output of the differential amplifier 38 is either too large or too small.

In a typical system of the prior art, the equilization was carried out manually by the listener. After listening for a while, the listener manually adjusted one or more controls to perform the equilization to his liking. If the program material subsequently changed its nature appreciably, as not uncommonly occurs between bands on a record or between scenes in a motion picture, the listener often found it desirable to readjust the equalization.

In accordance with the present invention, the manual adjustment is replaced by an automatic equalization function that is provided through the circuit of FIG. 2. In working out this innovation, the present inventor found that a simple feedback loop control system was inadequate, and a more sophisticated controller was required to enable the system to cope with certain not uncommon types of program material.

For example, there may sometimes be passages in the program material, such as special effects, during which the left or right channel will be used almost exclusively for many seconds of time. If it were not for the analog switch 42 and the window comparator 44, the remainder of the equalization circuit of FIG. 2 would proceed to equalize the channels under these abnormal conditions. Thereafter, when a normally balanced passage in the program material is encountered, the equalization will be found to be badly out of balance, at least for several seconds until the circuit responds to readjust the equalization. To avoid this type of problem, the window comparator 44 opens the analog switch 42 when the envelope detected L and R signals differ by more than 6 db in a preferred embodiment, as will be described below in relation to FIG. 6.

At other times there may be quiet passages in the program material during which both the left and right signals are extremely small relative to their normal levels. If it were not for the analog switch 42 and the window comparator 44, the remainder of the equalization circuit of FIG. 2 would proceed to lower the gain of the amplifier 30 if both channels are quiet, or would proceed to alter the gain in an erratic manner if the signals are comparable in magnitude to the noise present or if the program material alternated between left and right (as in a conversation). In either case, the equalization may be badly out of balance when a normally balanced passage is encountered. To avoid this type of problem, the window comparator 44 opens the analog switch 42 when the envelope detected L+R signal falls 6 db or more below a predetermined normal level, as will be described below in relation to FIG. 6.

FIG. 6 is a more detailed showing of the circuitry of the window comparator 44 in a preferred embodiment.

The difference signal on the line 130 of FIG. 2 is applied in FIG. 6 to the comparators 132, 134. Also, the envelope detected L+R signal (obtained either from line 60 of the circuit of FIG. 3 or by envelope detecting the signal on terminal 52 of FIG. 2) is applied to the comparator 136.

In the logic system used in the preferred embodiment, the comparator 132 produces a signal so long as the L−R difference signal exceeds a preset voltage $V_{R1}$. The comparator 134 produces a signal so long as the L−R difference signal is less than a second present voltage $V_{R2}$. Finally, the comparator 136 produces a signal so long as the envelope detected L+R signal exceeds a third preset voltage $V_{R3}$.

So long as signals from all three comparators 132, 134, 136 are present, the AND gate 138 produces a signal on the line 140 that keeps the analog switch 42 in the closed (conductive) state.

However, the analog switch will revert to the open state if the magnitude of the difference signal on line 130 becomes too great or if the envelope detected L+R signal becomes less than a preset amount.

In the preferred embodiment, the reference voltages $V_1$, $V_{R2}$, and $V_{R3}$ are chosen so that the analog switch opens if:

(1) the envelope detected value of R exceeds the envelope detected value of L by 6 or more decibels; or, (2) the envelope detected value of L exceeds the envelope detected value of R by 6 or more decibels; or, (3) the envelope detected value of L+R falls to 6 db or more below its normal value.

Because the time constant of the low-pass filter is 20 to 100 sec., its output on the line 32 is a slowly varying signal that, when applied to the variable gain amplifier 30, gradually adjusts the average magnitude of the signal L in an effort to make it equal to the average magnitude of the signal R. It is in this sense that the signals L and R are equalized by the circuit of FIG. 2.

Also shown in FIG. 2 are a differential amplifier 46 for producing at the terminal 50 a signal equal to the difference of the instantaneous values of the L signal and the R signal. The summing network 48 produces on the terminal 52 a signal equal to the sum of the instantaneous values of the L and R signals. The terminals 50, 52 are also shown in FIG. 3.

As shown in FIG. 3, the signals L+R on the terminal 52 and L−R on the terminal 50 are applied respectively to the envelope detectors 54, 56, which have the effect of smoothing and filering the signals. The outputs of the envelope detectors 54, 56 are then applied to the differential amplifier 58.

It is helpful to think of the L signal as being composed of two components: a part c which is also a component of the R signal; and a part 1 which is exclusive to the L signal. Likewise, the R signal consists of the common component c and the exclusive right component r.

The sum L+R therefore includes the common component c twice, while the common component c is absent from the difference signal L−R. Accordingly, when L and R are properly equalized by the circuit of FIG. 2, the output of the envelope detector 54 on the line 60 tends to be greater than the output of the envelope detector 56. The present inventor has discovered that this situation can be corrected by applying the output of the envelope detector 54 on the line 60 to a voltage divider 62, the output of which is 40 percent of its input in the best mode of practicing the invention. However, in other modes, the factor should range between 0.2 and 0.6. The use of the voltage divider 62 prevents the differential amplifier 58 from being excessively and undesirably biased in the direction of too much commonality.

The output of the differential amplifier 58 on the line 64 has been found to be a measure of the percent of the total power that should be allocated to the center speaker or speakers.

As discussed above, the commonality index k is the basis on which the electrical power is steered among the speakers. As described above, k ranges between 0 and a maximum value which is taken to be 100 percent. When k=0, the program is entirely stereophonic, there is no commonality between the signal L and R, and the center speaker 16 is not activated. On the other hand, when k=1, the program is entirely monophonic, and only the center speaker 16 is activated. The index k measures the percent of the total electrical power that is fed to the center speaker or speakers. The signals applied to the speakers 14, 16, 18 are linear functions of the signals L, R, and the coefficients that multiply L and R in the linear functions are themselves functions of only k. It is clear from the circuit of FIG. 3 that k varies with time as the program material evolves. Thus, in the present invention the allocation of electrical power among the speakers varies with time as the spatial qualities of the program change. Also, and usually at a faster rate, the signals L and R vary with time.

The remainder of the circuit of FIG. 3 is used to produce at the terminals 20, 22, 24 the signals to be applied to the speakers 14, 16, 18 respectively of FIG. 1.

The circuit 66 produces an output equal to (1−k)/2. This signal is applied to the square root circuit 70 to produce on the line 74 a signal equal to the square root of (1−k)/2. Similarly, the square root circuit 68 produces on the line 72 a signal that represents the square root of k.

The reason for taking the square roots is that the signals on the lines 72 and 74 are used to control the gains of the voltage controlled amplifiers 76, 78, 80, 82 and it is desired that the power in the outputs of those voltage controlled ampliers should be related to k and to (1−k)/2. Since the power is related to the square of the output voltage of those amplifiers, it is necessary that the square roots be taken. The signal on the line 72 which represents the square root of k is applied to determine the gain of the voltage controlled amplifier 76 to which the signal L+R is applied as an input. The output of the voltage controlled amplifier 76 on terminal 22 is a signal equal to the square root of k times (L+R).

The signal on the line 74 which represents the square root of (1−k)/2 is applied to determine the gain of the voltage controlled amplifier 82 to which the signal R is applied as an input. The output on the line 94 represents R times the square root of (1−k)/2.

The signal on the line 72 is divided by two in the voltage divider 84 and then applied to determine the gain of the voltage controlled amplifier 78, to which the difference signal L−R is applied as an input. The output of the voltage controlled amplifier 78, on the line 86, represents (L−R) times the square root of k/4.The signal on the line 74 is applied to determine the gain of the voltage controlled amplifier 80 to which the signal L is applied as an input. The output of the voltage controlled amplifier 80 along with the signal on the line 86 are applied to the summing network 88 to produce the indicated summation signal at the terminal 20.

The signal on the line 86 is inverted by the inverter 90 and applied, along with the signal on the line 94 to the summing network 92 to produce the indicated signal at the terminal 24.

Thus, it has been shown how the voltages applied to the speakers 14, 16, and 18 are developed by the circuit of FIG. 3. It will be found upon analysis that as k varies, the total power applied to the speakers remains substantially constant, although its allocation is determined solely by the instantaneous value of k.

FIGS. 4 and 5 show an alternative embodiment of the present invention. The diagram of FIG. 4 shows a plan view of a room 96 in which a listener 98 listens to four speakers. The left speaker 100 is located at the left side of the room, the right speaker 106 is located at the right side of the room, and the first center speaker 102 and the second center speaker 104 are located at the center of the front of the room as closely together as practical, so that as a close approximation, the acoustical power of the speakers 102, 104 is perceived as coming from substantially the same location. The speakers are activated by signals applied to the terminals 108, 110, 112, and 114, which terminals are also shown in FIG. 5.

Turning now to the steering circuit of FIG. 5, it will be noted that the front portion of the circuit including the line 64 and the square root circuit 68 are identical to those shown in FIG. 3 and described above. The circuit of FIG. 5 uses as inputs the signals L, R, L+R, and L−R that were developed in FIG. 2.

As in FIG. 3, the commonality index k is developed on the line 64 and the square root of k is developed by the square root circuit 68, so that the signal on the line 72 represents the square root of k.

The signal on the line 72 is applied to determine the gain of the voltage controlled amplifier 116 to which the signal L is applied as an input, to develop at the terminal 110 a signal equal to L times the square root of k. The signal on the line 72 is also applied to determine the gain of the voltage controlled amplifier 118 to which the signal R is applied as an input, to produce at the output terminal 112 a signal equal to R times the square root of k.

The signal on the line 64 is applied to the circuit 124 that produces as an output a signal equal to 1−k. That signal is applied to the square root circuit 126 to produce on the line 128 a signal that represents the square root of (1−k).

The signal on the line 128 is applied to determine the gain of the voltage controlled amplifier 120 to which the signal L is applied as an input to produce at the terminal 108 a signal equal to L times the square root of (1−k). The signal on the line 128 is also applied to determine the gain of the voltage controlled amplifier 122 to which the signal R is applied as an input to produce at the terminal 114 a signal equal to R times the square root of (1−k).

Analysis will show that the total power delivered to the speakers is independent of k and in fact is equal to L squared plus R squared. This result confirms that the overall loudness perceived by the listener is independent of the spatial qualities of the sound and depends only on the amplitude of the program materials.

It is seen that in accordance with the present invention, the virtual sound source intermediate the two speakers in a conventional stereo system has been replaced by an actual physical sound source in the present invention. As a result, it is no longer necessary for the listener to remain equidistant from the left and right speakers as he was required to do with a conventional stero system in order to locate properly the virtual sound source.

The foregoing detailed description is illustrative of several embodiments of the invention, and it is to be understood that additional embodiments thereof will be obvious to those skilled in the art. The embodiments described herein together with those additional embodiments are considered to be within the scope of the invention.

What is claimed is:

1. Apparatus for automatically equalizing a first signal and a second signal, comprising in combination:

variable gain amplifier means for producing in response to the first signal an amplified first signal;

first envelope detector means connected to said variable gain amplifier means and responsive to the amplified first signal to produce an envelope detected first signal;

second envelope detector means for producing in response to the second signal an envelope detected second signal;

differential amplifier means connected to said first envelope detector means and connected to said second envelope detector means, for producing an error signal in response to the envelope detected first signal and the envelope detected second signal;

feedback loop means connected to said differential amplifier means for receiving the error signal and for producing in response to the error signal a gain signal, and connected to said variable gain amplifier means for applying to it the gain signal, the gain signal increasing the gain of said variable gain amplifier means when the envelope detected first signal is less than the envelope detected second signal, and decreasing the gain of said variable gain amplifier means when the envelope detected first signal is greater than the envelope detected second signal, said feedback loop means further comprising low pass filter means connected to said differential amplifier means for receiving the error signal, responsive to the error signal to produce a filtered error signal, and connected to said variable gain amplifier means for applying to it as the gain signal the filtered error signal.

2. The apparatus of claim 1 wherein said feedback loop means further comprise in combination:

switch means connected to said differential amplifier means and responsive to the error signal for opening the connection between said differential amplifier and said variable gain amplifier when the magnitude of the error signal, without regard for its sign, exceeds a preset limit.

3. Apparatus for automatically equalizing a first signal and a second signal, comprising in combination:

variable gain amplifier means for producing in response to the first signal an amplified first signal;

first envelope detector means connected to said variable gain amplifier means and responsive to the amplified first signal to produce an envelope detected first signal;

second envelope detector means for producing in response to the second signal an envelope detected second signal;

differential amplifier means connected to said first envelope detector means and connected to said second envelope detector means, for producing an error signal in response to the envelope detected first signal and the envelope detected second signal;

feedback loop means connected to said differential amplifier means for receiving the error signal and for producing in response to the error signal a gain signal, and connected to said variable gain amplifier means for applying to it the gain signal, the gain signal increasing the gain of said variable gain amplifier means when the envelope detected first signal is less than the envelope detected second signal, and decreasing the gain of said variable gain amplifier means when the envelope detected first signal is greater than the envelope detected second signal, said feedback loop means further comprising switch means connected to said differential amplifier means and responsive to the envelope detected sum of the first signal and the second signal for opening the connection between said differential amplifier and said variable gain amplifier when the magnitude of said sum if less than a preset level.

* * * * *